US006476661B2

(12) United States Patent
Iliasevitch

(10) Patent No.: US 6,476,661 B2
(45) Date of Patent: Nov. 5, 2002

(54) PRECISE CONTROL OF VCE IN CLOSE TO SATURATION CONDITIONS

(75) Inventor: Stepan Iliasevitch, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/817,292

(22) Filed: Mar. 27, 2001

(65) Prior Publication Data

US 2001/0043110 A1 Nov. 22, 2001

(30) Foreign Application Priority Data

Mar. 29, 2000 (CA) ............................................ 2302900

(51) Int. Cl.[7] ................................................ H03K 17/04
(52) U.S. Cl. ........................ 327/375; 327/512; 327/538
(58) Field of Search ................................ 327/538, 540, 327/541, 375, 512, 513

(56) References Cited

U.S. PATENT DOCUMENTS 5,111,071 A * 5/1992 Kwan et al. .................. 327/77
6,218,894 B1 * 4/2001 De Langen et al. ......... 327/312

* cited by examiner

*Primary Examiner*—Terry D. Cunningham
*Assistant Examiner*—Quan Tra

(57) ABSTRACT

A pull-down circuit uses an npn transistor operating at close to saturation and the collector/emitter voltage is used as the pull-down voltage. To keep this within strict limits the npn transistor is connected in circuit with other transistors and resistors as well as a current source that generates a current proportional to absolute temperature. By selecting the values of the resistors and transistor parameters the collector/emitter voltage may be kept stable within a small range over wide temperature variation.

18 Claims, 4 Drawing Sheets

PRECISE CONTROL OF VCE IN CLOSE TO SATURATION CONDITIONS

FIELD OF THE INVENTION

This invention relates to bipolar junction transistor (BJT) circuits in which an output transistor is driven close to saturation.

BACKGROUND OF THE INVENTION

CMOS (complementary metal oxide semiconductor) circuits require that the voltage of a signal be at either one of two predetermined voltage levels, one high and one low, typically 3.3 volts and 0 volts. However, output signals from BJT (bipolar junction transistor) circuits are usually at either of two values which differ from the predetermined levels required by the CMOS circuitry. Thus, in order for a BJT circuit to be coupled to a CMOS circuit these BJT values have to be pulled up to 3.3 volts and pulled down to 0 volts.

Typically, it has been found that pull-up to 3.3 volts can be achieved easily but pull-down is problematic. Typically, pull-down is achieved by driving an npn transistor close to saturation and using the collector/emitter voltage, VCE, as the pull-down voltage. In practice, the pull-down voltage achieved falls in a range 0.1–0.75 volts above the predetermined CMOS low reference level. However, according to the CMOS specification the pull-down voltage must be less than 0.5 volts above the low reference level. Furthermore, to avoid saturation, the pull-down voltage should preferably be greater than 0.2 volts above the low reference level. Thus, the pull-down voltage should fall in a range 0.2–0.5 volts above the low reference level.

There is clearly a discrepancy between the 0.2–0.5 volt range required for proper operation and the range 0.1–0.75 achieved in practice. If the pull-down voltage actually falls outside the 0.2–0.5 volt range the circuit would be considered unacceptable or failed.

It is an object of the invention to obviate or mitigate this problem.

SUMMARY OF THE INVENTION

According to one aspect of the invention there is provided a method of controlling the collector/emitter voltage of a bipolar junction transistor operating close to saturation comprising injecting a current which is proportional to absolute temperature parallel to the base emitter junction and selecting the values of certain circuit components connected to the transistor to provide a predetermined variation with temperature of the collector/emitter voltage.

According to another aspect of the invention there is provided a method of controlling the collector/emitter voltage of a bipolar junction transistor operating close to saturation comprising injecting a current which is proportional to absolute temperature parallel to the base emitter junction and selecting the values of certain circuit components connected to the transistor to minimise the variation with temperature of the collector/emitter voltage.

According to yet another aspect of the invention there is provided a circuit comprising first and second bipolar junction transistors each having a base, an emitter and a collector, at least two resistors, a voltage drop device and a current source arranged to generate a current iPTAT which is proportional to absolute temperature, wherein: the bases of the first and second transistors are connected together; the first resistor is connected across the base/emitter junction of the second transistor; the second resistor is connected across the base/collector junction of the first transistor; the current source is connected across the base/emitter junction of the first transistor; the emitters of the first and second transistors are both connected to a biasing voltage terminal; the collector of the first transistor is connected directly or indirectly to an input terminal; the voltage drop device is connected between the input terminal and the collector of the second transistor; and the values of at least the first and second resistors are selected to provide a predetermined variation with temperature of the voltage VCE across the collector/emitter of the second transistor.

DETAILED DESCRIPTION OF THE DRAWINGS

DETAILED DESCRIPTION OF THE PREFERRED EMBODIMENT

Figure 1:
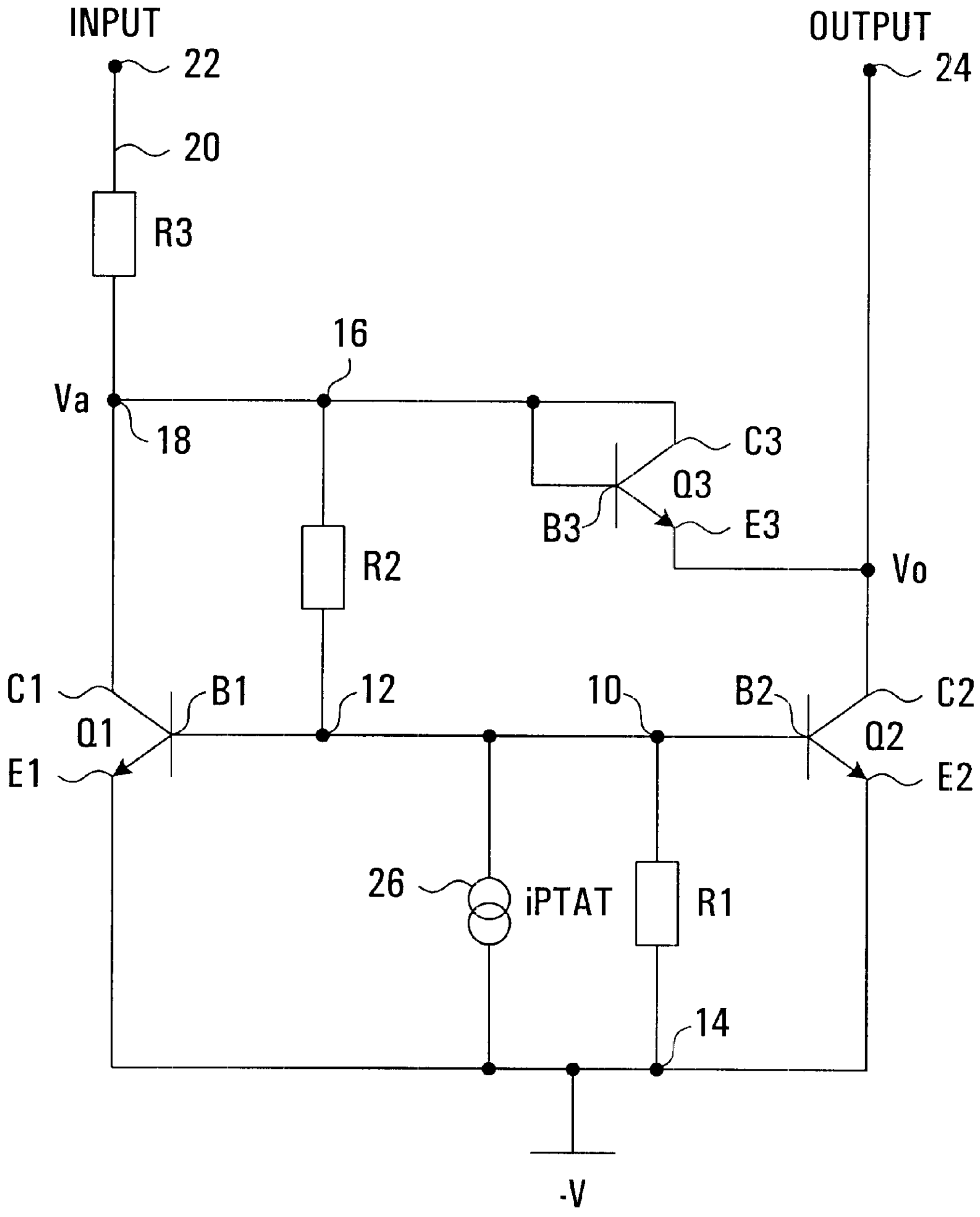
FIG. 1 is a circuit diagram of a pull-down circuit according to one embodiment of the present invention.

Referring to FIG. 1, three npn transistors Q1, Q2 and Q3 and three resistors R1, R2 and R3, are connected together to form a pull-down circuit.

More specifically, the base B1 of first transistor Q1 is connected to the base B2 of second transistor Q2. Both of these bases are also connected to a first terminal 10 of first resistor R1 and to a first terminal 12 of second resistor R2. A second terminal 14 of resistor R1 is connected to the emitter E1 of transistor Q1 and to the emitter E2 of transistor Q2. Thus, resistor R1 is connected across the base/emitter junctions of both transistors Q1 and Q2. Terminal 14 is also connected to a negative power supply voltage terminal -V.

A second terminal 16 of resistor R2 is connected to the collector C1 of transistor Q1 such that resistor R2 can be said to be connected across the collector/base junction of transistor Q1. The second terminal 16 is also connected to one terminal 18 of third resistor R3 the other terminal 20 of which is connected to an input voltage terminal 22.

The third transistor Q3 is diode connected. That is to say its base B3 is directly connected to its collector C3. The terminal 16 of resistor R2 is also connected to the base and collector of transistor Q3. The collector C2 of transistor Q2 is connected to the emitter E3 of transistor Q3 and to an output voltage terminal 24.

Finally, a current source 26 is connected between the base B1 and emitter E1 of transistor Q1. The current source 26 is of a type which produces a current iPTAT which is directly proportional to the absolute temperature of the device. Such current sources are well known and can for example take the form of a bandgap reference circuit. A typical example of which is shown in FIG. 4.

Figure 4:
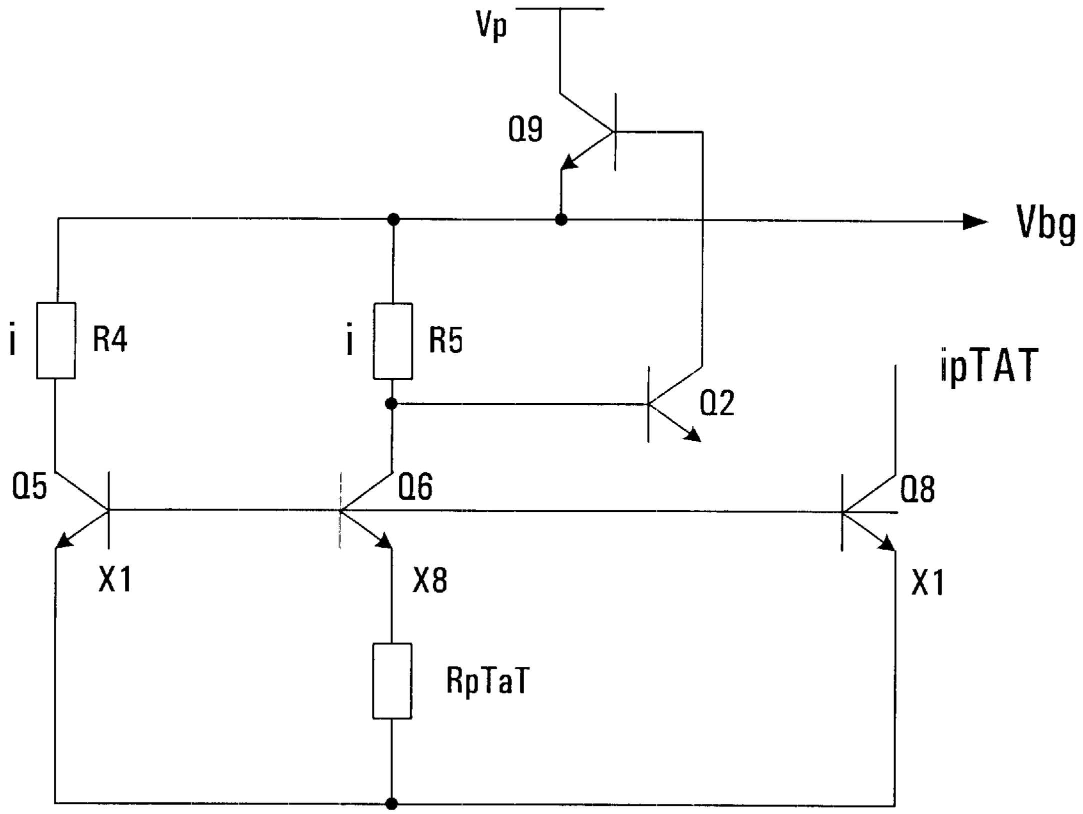
FIG. 4 is a circuit diagram of a typical bandgap reference circuit.

Referring to FIG. 4, it is known that the bandgap voltage $$Vbg = VbeQ7 + \frac{m}{RPTAT}Vt \tag{1}$$

Where m is a constant, RPTAT is the value of resistor RPTAT, $Vbe_Q7$ is the base/emitter voltage of transistor Q7 and Vt is the temperature voltage obtained from $$Vt = \frac{kT^\circ}{q} \quad (2)$$

where k is Boltzmann Constant, q is electron charge and T° is absolute temperature in ° Kelvin.

Figure 5:
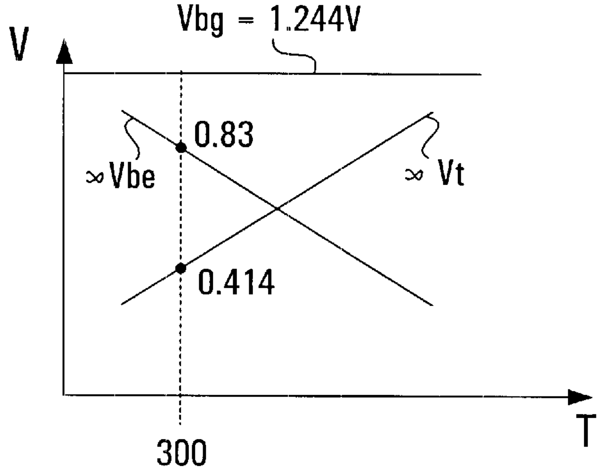
FIG. 5 is a sketch illustrating the response of the circuit of FIG. 4.

It is known also that equation (1) can be represented graphically as shown in FIG. 5.

It is known also that the collector current of transistor Q8, $$iPTAT = \frac{mVt}{RPTAT} \quad (3)$$

The operation of the circuit of FIG. 1 will now be analysed in terms of the output voltage $V_O$ obtained at output terminal 24 when a voltage VI present on input terminal 22 is at a high level and Q2 is on and operating close to saturation.

Voltage VI in terminal 22 gives rise to a voltage VA at terminal 18 of resistor R3.

It can be readily understood that:

$$V_A = Vbe_Q1 + V_R2 \quad (4)$$

and $$V_O = V_A - Vbe_Q3 \quad (5)$$

where $Vbe_Q$1 and $Vbe_Q$3 respectively indicate the base/emitter voltage of transistor Q1 and the base/emitter voltage of transistor Q3.

Substituting $V_A$ from equation (4) into equation (5) gives $$V_O = V_{CEQ}2 = Vbe_Q1 + V_R2 - Vbe_Q3 \quad (6)$$

$$= Vbe_Q1 - Vbe_Q3 + V_R2; \quad (7)$$

It can also readily be understood that:

$$VR2 = R2\left(iPTAT + \frac{VbeQ1}{R1}\right) \quad (8)$$

Substituting $V_R$2 from equation (8) into equation (7) gives $$Vo = VbeQ1 - VbeQ3 + R2iPTAT + \frac{R2}{R1}VbeQ1 \quad (9)$$

Substituting $i_{PTAT}$ from equation (3) into equation (9) gives $$Vo = VbeQ1 - VbeQ3 + \frac{R2}{R1}VbeQ1 + \frac{R2\ mVt}{RPTAT} \quad (10)$$

It is known from basic transistor theory that the ratio of the currents i1 and i3 flowing through the collectors (or emitters assuming the base current is negligible) of two transistors Q1 and Q3 which are identical except that they have different sizes of area A1 or A3 of the emitter/base junction can be expressed $$\frac{i1}{i3} = \frac{A1}{A3}e^{\left(\frac{VbeQ1-VbeQ3}{Vt}\right)} \quad (11)$$

Where Vt is the temperature voltage and this derives to $$VbeQ1 - VbeQ3 = -Vt\ln\left|\frac{i3A1}{i1A3}\right| \quad (12)$$

$$Vo = -Vt\ \ln\left|\frac{i3A1}{i1A3}\right| + \frac{R2}{R1}VbeQ1 + mR2\ \frac{mVt}{RPTAT} \quad (13)$$

$$= \frac{R2}{R1}VbeQ1 + Vt\left(\frac{mR2}{RPTAT} - \ln\left|\frac{i3A1}{i1A3}\right|\right) \quad (14)$$

Let $$\frac{R2}{R1}$$

be represented by A and let $$\frac{mR2}{RPTAT} - \ln\frac{i3A1}{i1A3}$$

be represented by B.

Then equation (14) may be written $$V_O = AVbe_Q1 + BVt \quad (15)$$

It is noted that equation 15 is of the same form as equation (1) describing the operation of the bandgap reference circuit. Thus, considering FIG. 5, A is equivalent to a negative temperature coefficient and B a positive temperature coefficient.

To find A and B for $V_O$=0.3 volts , for example, and $V_O$ to be independent of T° we try to obtain these values near room temperature (300° K.) because if true at all temperatures it is true at 300° K.

Substituting $V_O$=0.3 in equation (15) gives $$AVbe_Q1 + BVt = 0.3 \quad (16)$$

At T°=300 it is known from FIG. 5 that $$\frac{AVbeQ1}{BVt} \approx 0.2 \quad (17)$$

At T°=300°, $Vbe_Q$1=0.83 V and Vt=0.026 V.

Inserting these values in equations (16) and (17) allows us to find values for A and B.

Looking again at $$B = \frac{mR2}{RPTAT} - \ln\left|\frac{i3A1}{i1A3}\right|,$$

we know $$\frac{i3}{i1}$$

=current gain of the current mirror created by Q1 and Q2 and as a result $$\frac{i3}{i1} = \frac{iQ2}{iQ1} = \frac{A2}{A1}$$

Substituting $$\frac{A2}{A1}$$

for $$\frac{i3}{i1}$$

in the value for B we get $$B = \frac{mR2}{RPTAT} - \ln\left|\frac{A2}{A3}\right| \tag{19}$$

and as previously defined $$A = \frac{R2}{R1} \tag{20}$$

As we have determined the values of A and B to give $V_O$=0.3 volts we can then determine from equations (19) and (20) the values of R1, R2, A2 and A3 necessary to achieve $V_O$=0.3 volts irrespective of temperature.

It should be noted that matching by locating components in close proximity, using similar physical dimensions etc. should be attempted with respect to all of the transistors Q1, Q2 and Q3 and also matching of the transistors R1, R2 and RPTAT should be carried out for optimum temperature stability.

Figure 2:
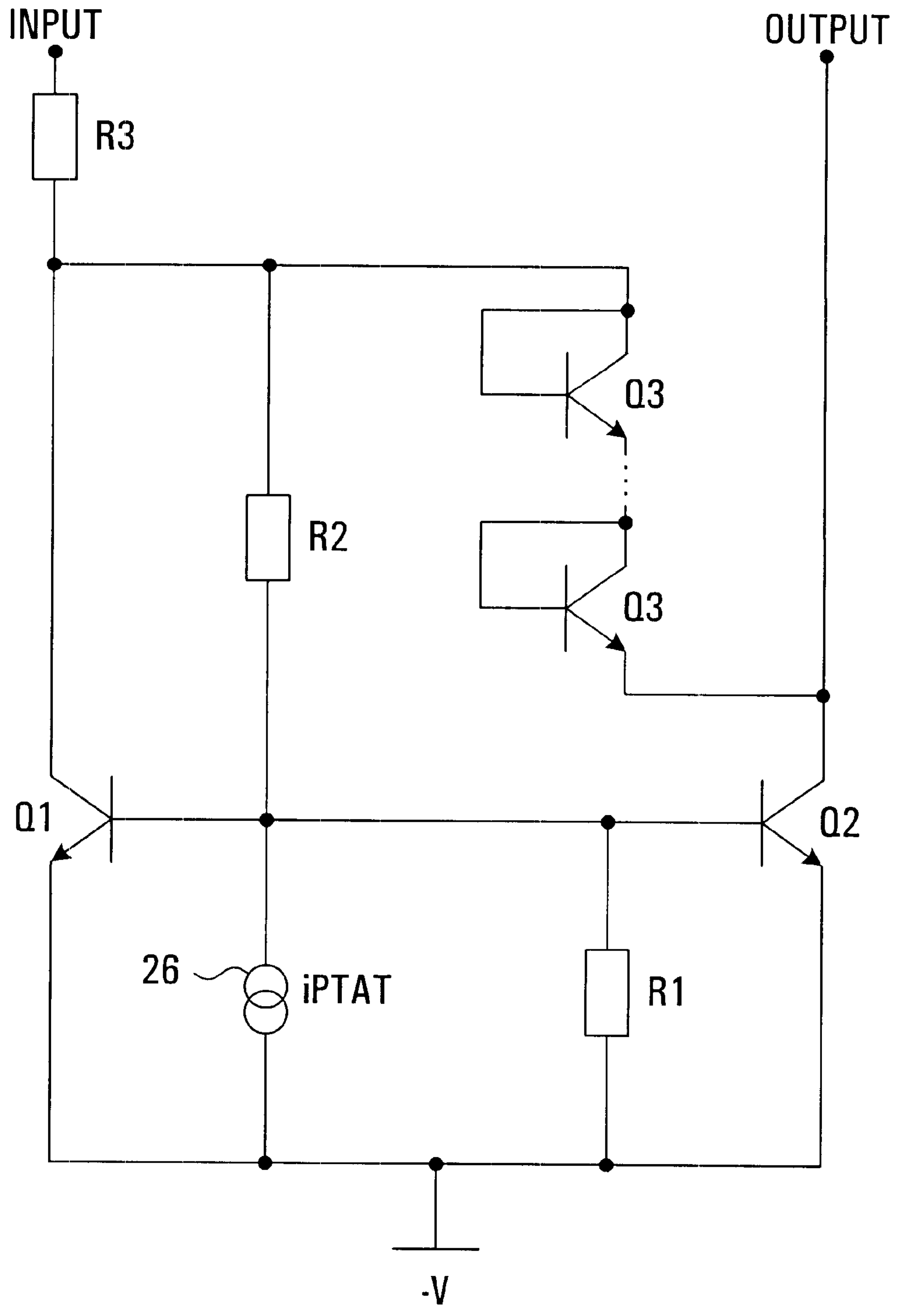
FIG. 2 is a circuit diagram of a pull-down circuit according to another embodiment of the present invention.

Referring now to FIG. 2, this is a modification of the FIG. 1 embodiment in which the single diode connected transistor Q3 is replaced by two or more diode connected transistors Q3 connected such that the emitter of one is connected to the collector/base of the following one.

Figure 3:
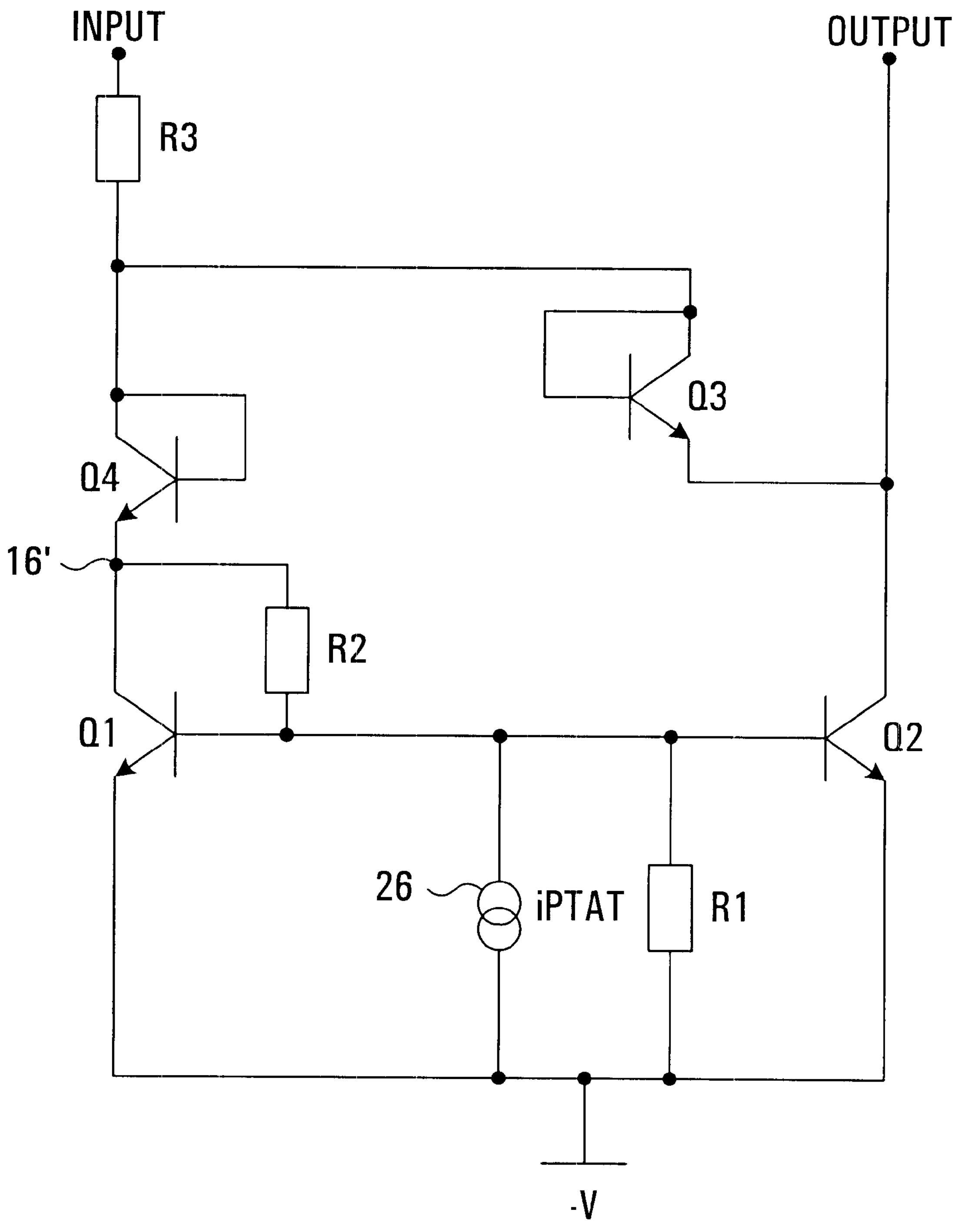
FIG. 3 is a circuit diagram of a pull-down circuit according to yet another embodiment of the present invention.

With reference to FIG. 3, this circuit is similar to the circuit of FIG. 1 except that a fourth transistor Q4 is provided as a current mirror with respect to transistor Q3. Thus, the emitter of transistor Q4 is connected to the collector of transistor Q1 and the diode connected collector/base is connected to input resistor R3 as well as to the base/collector of transistor Q3. In this embodiment, while R2 is still connected across the collector/base junction of transistor Q1, the end 16' of resistor is no longer connected to the base/collector of transistor Q3.

It is noted that each of the single transistors Q3 and Q4 could be replaced with a series of identical transistors in the manner of FIG. 2.

Although the invention has been described with reference to a pull-down circuit it should not be limited to such use. The invention may be used in any circuit where low output voltage may be expected such as in a current mirror circuit or where high voltage swings may be expected such as the output stage of an amplifier.

The circuits of FIGS. 1 to 3 are, in essence, current mirror circuits in which the output voltage is switched between high and low. Without such switching the circuit would be recognised as a current mirror rather than a pull-down circuit.

Furthermore, although the invention has been described in terms of npn transistors the invention could also be used with pnp transistors with appropriate positive biasing voltage replacing voltage terminal V-.

As another modification, the preferred embodiment as shown in FIG. 1 uses a diode connected transistor Q3 to provide a necessary voltage drop Vbe. However, it is envisaged that the voltage drop could conceivably be obtained using a single diode or resistor (or some other combination of components) instead of transistor Q3. Generally such a device is refined to hereinafter as a voltage drop device.

The invention was conceived primarily to provide a stable output voltage but the invention could be used to provide a predetermined positive or negative change in voltage with temperature.

What is claimed is:

1. A circuit comprising first and second bipolar junction transistors each having a base, an emitter and a collector, at least two resistors, a voltage drop device and a current source arranged to generate a current iPTAT which is proportional to absolute temperature, wherein:

the bases of the first and second transistors are connected together;

the first resistor is connected across the base/emitter junction of the second transistor;

the second resistor is connected across the base/collector junction of the first transistor;

the current source is connected across the base/emitter junction of the first transistor;

the emitters of the first and second transistors are both connected to a biasing voltage terminal;

the collector of the first transistor is connected directly or indirectly to an input terminal;

the voltage drop device is connected between the input terminal and the collector of the second transistor; and the values of at least the first and second resistors are selected to provide a predetermined variation with temperature of the voltage $V_{CE}$ across the collector/emitter of the second transistor.

2. A circuit according to claim 1 wherein the values of the first and second resistors are selected to minimize the variation with temperature of the voltage $V_{CE}$.

3. A circuit according to claim 1 wherein the voltage drop device is at least one third diode connected transistor having an emitter connected to the collector of the second transistor and having a base and collector connected to the input terminal.

4. A circuit according to claim 3 wherein the second and third transistors have base/emitter junctions with cross-sectional areas which are selected to provide the predetermined variation.

5. A circuit according to claim 4 wherein the values of the first and second resistors and the cross-sectional areas are selected to minimize the variation with temperature of the voltage VCE.

6. A circuit according to claim 3, wherein the collector of the first transistor is connected to the collector and base of the third transistor.

7. A circuit according to claim 1, wherein a third resistor is connected between the input terminal and the collector of the first transistor.

8. A circuit according to claim 2, wherein a third resistor is connected between the input terminal and the collector of the first transistor.

9. A circuit according to claim 3, wherein a third resistor is connected between the input terminal and the collector of the first transistor.

10. A circuit according to claim 3, wherein there is a plurality of third diode connected transistors each of which has its collector connected to its base and the emitter of one connected to the collector of a following one.

11. A circuit according to claim 3, further comprising at least one diode connected fourth transistor having an emitter connected to the collector of the first transistor and a collector and base connected together and to the collector and base of the third transistor.

12. A circuit according to claim 11, wherein a third resistor is connected between the input terminal and the collector of the fourth transistor.

13. A circuit according to claim 11, wherein there is a plurality of diode connected third transistors each of which has its collector connected to its base and the emitter of one connected to the collector of a following one; and a plurality of fourth transistors each of which has its collector connected to its base and the emitter of one connected to the collector of a following one.

14. A circuit according to claim 12, wherein there is a plurality of diode connected third transistors each of which has its collector connected to its base and the emitter of one connected to the collector of a following one; and a plurality of fourth transistors each of which has its collector connected to its base and the emitter of one connected to the collector of a following one.

15. A circuit according to claim 1, arranged to operate as a current mirror.

16. A circuit according to claim 1, arranged to operate on a hold-down circuit.

17. A circuit according to claim 1, wherein an identical circuit is additionally connected between the input terminal and the output terminal thereby forming an amplifier output stage.

18. A circuit according to claim 1, wherein the transistors are npn transistors.

* * * * *

UNITED STATES PATENT AND TRADEMARK OFFICE

CERTIFICATE OF CORRECTION

PATENT NO. : 6,476,661 B2 
DATED : November 5, 2002
INVENTOR(S) : Stephen Iliasevitch It is certified that error appears in the above-identified patent and that said Letters Patent is hereby corrected as shown below:

<u>Column 4,</u>
Line 5, the following words were omitted and should be inserted between equations 12 and 13: -- Substituting for VbeQ1-VbeQ3 in equation (10) gives --

Signed and Sealed this

Seventeenth Day of June, 2003

JAMES E. ROGAN
*Director of the United States Patent and Trademark Office*